(12) United States Patent
Sultenfuss et al.

(10) Patent No.: US 10,278,279 B1
(45) Date of Patent: Apr. 30, 2019

(54) TRANSFORMER THERMAL RADIATOR FOR POWER FIELD EFFECT TRANSISTORS

(71) Applicant: Dell Products L.P., Round Rock, TX (US)

(72) Inventors: Andrew Thomas Sultenfuss, Leander, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/797,434

(22) Filed: Oct. 30, 2017

(51) Int. Cl.
| | |
|---|---|
| *H05K 7/20* | (2006.01) |
| *H05K 1/02* | (2006.01) |
| *H02M 1/44* | (2007.01) |
| *H01F 27/06* | (2006.01) |
| *H01F 27/22* | (2006.01) |
| *H01F 27/36* | (2006.01) |
| *H05K 1/18* | (2006.01) |
| *H05K 1/14* | (2006.01) |
| *H02M 1/32* | (2007.01) |

(52) U.S. Cl.
CPC .......... *H05K 1/0204* (2013.01); *H01F 27/06* (2013.01); *H01F 27/22* (2013.01); *H01F 27/362* (2013.01); *H02M 1/44* (2013.01); *H05K 1/0219* (2013.01); *H05K 1/144* (2013.01); *H05K 1/181* (2013.01); *H01F 2027/065* (2013.01); *H02M 2001/327* (2013.01); *H05K 2201/1003* (2013.01); *H05K 2201/10166* (2013.01)

(58) Field of Classification Search
None
See application file for complete search history.

(56) References Cited

U.S. PATENT DOCUMENTS

| | | | | |
|---|---|---|---|---|
| 5,598,327 | A * | 1/1997 | Somerville | ......... H01F 17/0006 29/606 |
| 6,293,700 | B1 * | 9/2001 | Lund | ........................ G01K 7/13 374/181 |
| 6,477,054 | B1 * | 11/2002 | Hagerup | ............. H01L 23/3677 174/262 |
| 8,164,904 | B2 * | 4/2012 | Matz | .................... H01L 25/0657 174/252 |
| 8,188,594 | B2 * | 5/2012 | Ganesan | ............... H01L 23/367 257/713 |
| 9,166,083 | B2 * | 10/2015 | Meinel | .................. H05K 1/0201 |
| 9,681,558 | B2 * | 6/2017 | Chen | ......................... H05K 7/06 |

(Continued)

OTHER PUBLICATIONS

Universal Serial Bus, "USB Power Delivery." Retrieved from <http://www.usb.org/developers/powerdelivery/> on Jun. 28, 2017; 3 pages.

(Continued)

*Primary Examiner* — Courtney L Smith
(74) *Attorney, Agent, or Firm* — Baker Botts L.L.P.

(57) ABSTRACT

A power adapter device may include a power field effect transistor (FET), a transformer including a radiant heat exchanger, and electrical conductors coupled between the power FET and the transformer. The electrical conductors may transfer heat generated by the power FET from the power FET to the transformer. The radiant heat exchanger may dissipate a portion of the heat to cool the power FET. As such, the radiant heat exchanger may function as a heat sink for the power FET, enabling efficient heat dissipation using a compact design.

20 Claims, 7 Drawing Sheets

(56) References Cited

U.S. PATENT DOCUMENTS

| | | | |
|---|---|---|---|
| 9,693,446 B2* | 6/2017 | Ragg | H05K 1/0212 |
| 9,867,275 B2* | 1/2018 | Chen | H05K 1/0203 |
| 10,128,764 B1* | 11/2018 | Vinciarelli | H02M 3/33523 |
| 2016/0359426 A1* | 12/2016 | Jitaru | H05K 1/0256 |

OTHER PUBLICATIONS

SMBus, "System Management Bus (SMBus)." Retrieved from <www.smbus.org> on Jun. 28, 2017; 2 pages.

UEFI, "Unified Extensible Firmware Interface (UEFI) Specification", Retrieved from <http://uefi.org> May 2017; 2899 pages.

* cited by examiner

TRANSFORMER THERMAL RADIATOR FOR POWER FIELD EFFECT TRANSISTORS

BACKGROUND

Field of the Disclosure

This disclosure relates generally to information handling systems and, more particularly, to a transformer thermal radiator for power field effect transistors.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable devices such as notebook computers, media players, personal data assistants, digital cameras, cellular phones, cordless phones, smart phones, tablet computers, and 2-in-1 tablet-laptop combination computers. A portable device may generally be any device that a user may carry for handheld use and that includes a processor. Typically, portable devices are powered using a rechargeable battery and include a display device.

SUMMARY

In one aspect, a disclosed power adapter device may include a transformer including a transformer printed circuit board (PCB), including primary windings, and a radiant heat exchanger thermally coupled to the transformer PCB. The power adapter device may also include a multilayer PCB configured to receive an alternating current (AC) power source. The multilayer PCB may further include a power field effect transistor (FET) coupled to the AC power source at a first input node and coupled to the primary windings at a first output node via a first electrical conductor, and a second electrical conductor in proximity to the power FET and coupled to the primary windings and to the AC power source. The first electrical conductor and the second electrical conductor may form a heat transfer path between the power FET and the transformer. When a first temperature of the power FET may be greater than a second temperature of the transformer, heat may flow via the heat transfer path to the transformer. The transformer may be cooled by the radiant heat exchanger, and the first temperature of the power FET may be maintained below a maximum value when the power FET is in operation.

In any of the disclosed embodiments of the power adapter device, the radiant heat exchanger may further comprise at least one of a copper moat, fins, a fin stack, a plate, a radiant cooler, a copper finger thermally coupled to an electromagnetic interference (EMI) shield.

In any of the disclosed embodiments of the power adapter device, the radiant heat exchanger may further comprise a chamber formed on the transformer PCB, the chamber filled with a thermally conductive insulator and thermally coupled to an EMI shield.

In any of the disclosed embodiments of the power adapter device, the radiant heat exchanger may comprise at least one of copper, graphene, graphite, aluminum nitride, an aluminum alloy, silicon carbide, and silicon nitride.

In any of the disclosed embodiments of the power adapter device, the power FET may further comprise one of a gallium nitride (GaN) FET and a gate all around (GAA) FET.

In any of the disclosed embodiments of the power adapter device, the first electrical conductor and the second electrical conductor may be formed as multilayer traces in the multilayer PCB. The first electrical conductor and the second electrical conductor may comprise copper.

In any of the disclosed embodiments of the power adapter device, the power FET may be operated using only the heat transfer path for cooling the power FET.

In another aspect, a disclosed transformer may include a transformer printed circuit board (PCB), including primary windings, and a radiant heat exchanger thermally coupled to the transformer PCB. The transformer may also be coupled to a multilayer PCB. The multilayer PCB may be configured to receive an alternating current (AC) power source. The multilayer PCB may further include a power field effect transistor (FET) coupled to the AC power source at a first input node and coupled to the primary windings at a first output node via a first electrical conductor, and a second electrical conductor in proximity to the power FET and coupled to the primary windings and to the AC power source. The first electrical conductor and the second electrical conductor may form a heat transfer path between the power FET and the transformer. When a first temperature of the power FET may be greater than a second temperature of the transformer, heat may flow via the heat transfer path to the transformer. The transformer may be cooled by the radiant heat exchanger, and the first temperature of the power FET may be maintained below a maximum value when the power FET is in operation.

In any of the disclosed embodiments of the transformer, the radiant heat exchanger may further comprise at least one of a copper moat, fins, a fin stack, a plate, a radiant cooler, a copper finger thermally coupled to an electromagnetic interference (EMI) shield.

In any of the disclosed embodiments of the transformer, the radiant heat exchanger may further comprise a chamber formed on the transformer PCB, the chamber filled with a thermally conductive insulator and thermally coupled to an EMI shield.

In any of the disclosed embodiments of the transformer, the radiant heat exchanger may comprise at least one of copper, graphene, graphite, aluminum nitride, an aluminum alloy, silicon carbide, and silicon nitride.

In any of the disclosed embodiments of the transformer, the power FET may further comprise one of a gallium nitride (GaN) FET and a gate all around (GAA) FET.

In any of the disclosed embodiments of the transformer, the first electrical conductor and the second electrical conductor may be formed as multilayer traces in the multilayer PCB. The first electrical conductor and the second electrical conductor may comprise copper.

In any of the disclosed embodiments of the transformer, the power FET may be operated using only the heat transfer path for cooling the power FET.

In a further aspect, a disclosed electrical circuit may include a transformer including primary windings, and a radiant heat exchanger thermally coupled to the transformer PCB. The electrical circuit may also include a power field effect transistor (FET) coupled to an alternating current (AC) power source at a first input node and coupled to the primary windings at a first output node via a first electrical conductor, and a second electrical conductor coupled to the primary windings and to the AC power source. The first electrical conductor and the second electrical conductor may form a heat transfer path between the power FET and the transformer. When a first temperature of the power FET may be greater than a second temperature of the transformer, heat may flow via the heat transfer path to the transformer. The transformer may be cooled by the radiant heat exchanger, and the first temperature of the power FET may be maintained below a maximum value when the power FET is in operation.

In any of the disclosed embodiments of the electrical circuit, the radiant heat exchanger may further comprise at least one of a copper moat, fins, a fin stack, a plate, a radiant cooler, a copper finger thermally coupled to an electromagnetic interference (EMI) shield.

In any of the disclosed embodiments of the electrical circuit, the radiant heat exchanger may further comprise a chamber formed on the transformer PCB, the chamber filled with a thermally conductive insulator and thermally coupled to an EMI shield.

In any of the disclosed embodiments of the electrical circuit, the radiant heat exchanger may comprise at least one of copper, graphene, graphite, aluminum nitride, an aluminum alloy, silicon carbide, and silicon nitride.

In any of the disclosed embodiments of the electrical circuit, the power FET may further comprise one of a gallium nitride (GaN) FET and a gate all around (GAA) FET.

In any of the disclosed embodiments of the electrical circuit, the power FET may be operated using only the heat transfer path for cooling the power FET.

BRIEF DESCRIPTION OF THE DRAWINGS

For a more complete understanding of the present disclosure and its features and advantages, reference is now made to the following description, taken in conjunction with the accompanying drawings, in which.

DESCRIPTION OF PARTICULAR EMBODIMENT(S)

Figure 1:
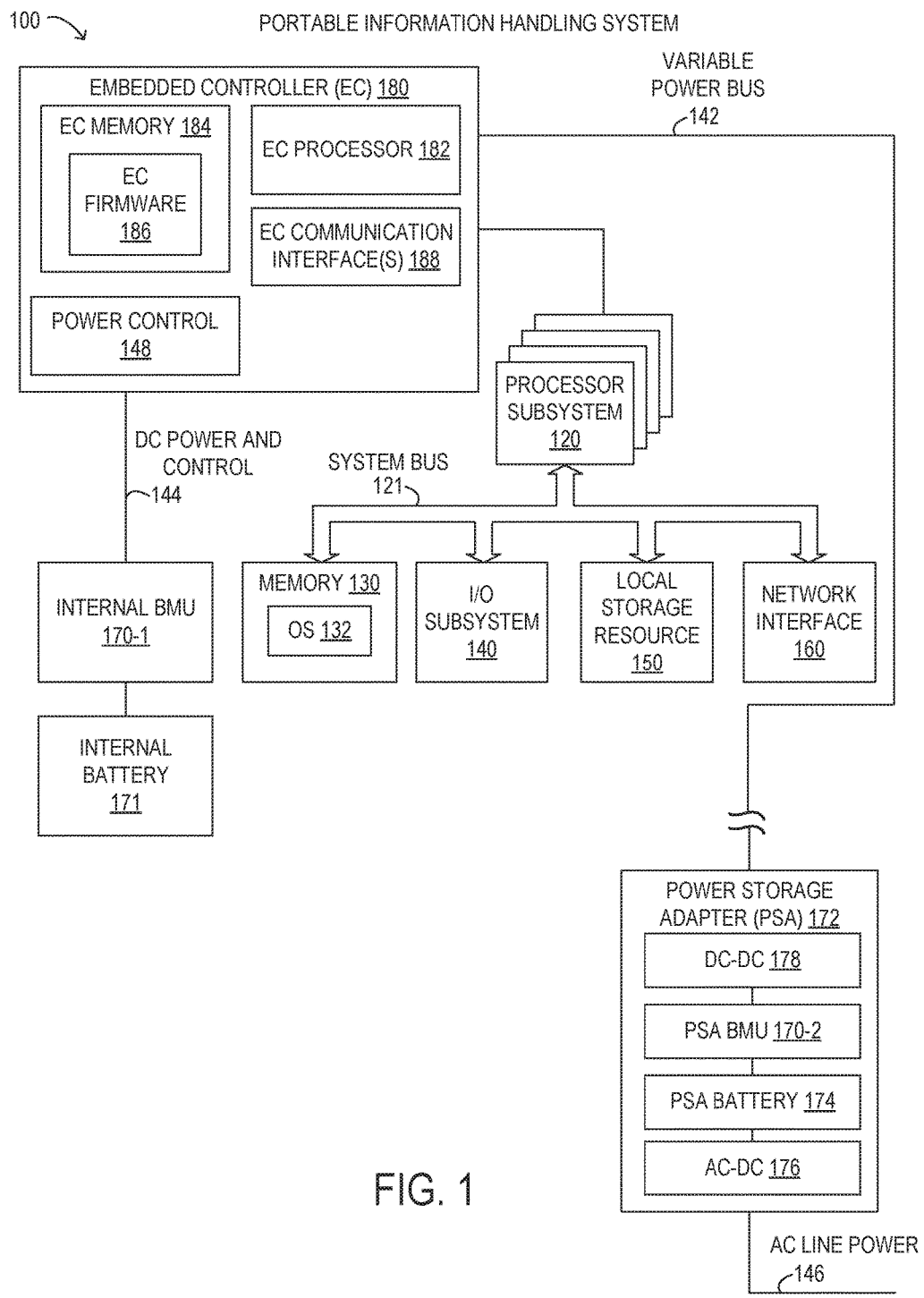
FIG. 1 is a block diagram of selected elements of a portable information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72".

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory (SSD); as well as communications media such wires, optical fibers, microwaves, radio waves, and other electromagnetic or optical carriers; or any combination of the foregoing.

Particular embodiments are best understood by reference to FIGS. 1, 2, 3, 4A, 4B, 4C, and 4D wherein like numbers are used to indicate like and corresponding parts.

Turning now to the drawings, FIG. 1 illustrates a block diagram depicting selected elements of an embodiment of portable information handling system 100. It is noted that FIG. 1 is not drawn to scale but is a schematic illustration. In various embodiments, portable information handling system 100 may represent different types of portable devices. A portable device may generally be any device that a user may carry for handheld use and that includes a processor. Typically, portable devices are powered using a rechargeable battery. Examples of portable information handling system 100 may include laptop computers, notebook computers, netbook computers, tablet computers, and 2-in-1 tablet laptop combination computers, among others. In some instances, portable information handling system 100 may represent certain personal mobile devices, and may further include examples such as media players, personal data assistants, digital cameras, cellular phones, cordless phones, smart phones, and other cellular network devices.

As shown in FIG. 1, components of information handling system 100 may include, but are not limited to, a processor subsystem 120, which may comprise one or more processors, and a system bus 121 that communicatively couples various system components to processor subsystem 120 including, for example, a memory 130, an I/O subsystem 140, local storage resource 150, and a network interface 160. Also shown within information handling system 100 are embedded controller 180 and an internal battery management unit (BMU) 170-1 that manages an internal battery 171. Furthermore, information handling system 100 is shown removably coupled to a power storage adapter 172 that incorporates various high efficiency features for use with portable information handling system 100, as disclosed herein. As shown, power storage adapter 172 may be an external device to portable information handling system 100 and may be coupled to portable information handling system 100 using a variable power bus 142, for example, using an appropriate connector, as described in further detail below.

As depicted in FIG. 1, processor subsystem 120 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 120 may interpret and execute program instructions and process data stored locally (e.g., in memory 130). In the same or alternative embodiments, processor subsystem 120 may interpret and execute program instructions and process data stored remotely (e.g., in a network storage resource).

In FIG. 1, system bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Also in FIG. 1, memory 130 may comprise a system, device, or apparatus operable to retain and retrieve program instructions and data for a period of time (e.g., computer-readable media). Memory 130 may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed. In FIG. 1, memory 130 is shown including an operating system (OS) 132, which may represent an execution environment for portable information handling system 100. Operating system 132 may be UNIX or be based on UNIX (e.g., a LINUX variant), one of a number of variants of Microsoft Windows® operating systems, a mobile device operating system (e.g., Google Android™ platform, Apple® iOS, among others), an Apple® MacOS operating system, an embedded operating system, a gaming operating system, or another suitable operating system.

In FIG. 1, local storage resource 150 may comprise computer-readable media (e.g., hard disk drive, floppy disk drive, CD-ROM, and other type of rotating storage media, flash memory, EEPROM, or another type of solid state storage media) and may be generally operable to store instructions and data, and to permit access to stored instructions and data on demand.

In FIG. 1, network interface 160 may be a suitable system, apparatus, or device operable to serve as an interface between information handling system 100 and a network (not shown). Network interface 160 may enable information handling system 100 to communicate over the network using a suitable transmission protocol or standard. In some embodiments, network interface 160 may be communicatively coupled via the network to a network storage resource (not shown). The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). The network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network coupled to network interface 160 or various components associated therewith may be implemented using hardware, software, or any combination thereof.

In information handling system 100, I/O subsystem 140 may comprise a system, device, or apparatus generally operable to receive and transmit data to or from or within information handling system 100. I/O subsystem 140 may represent, for example, a variety of communication interfaces, graphics interfaces, video interfaces, user input interfaces, and peripheral interfaces. In various embodiments, I/O subsystem 140 may be used to support various peripheral devices, such as a touch panel, a display adapter, a keyboard, an accelerometer, a touch pad, a gyroscope, or a camera, among other examples. In some implementations, I/O subsystem 140 may support so-called 'plug and play' connectivity to external devices, in which the external devices may be added or removed while portable information handling system 100 is operating.

Also shown in FIG. 1 is embedded controller (EC) 180, which may include EC processor 182 as a second processor included within portable information handling system 100 for certain management tasks, including supporting communication and providing various functionality with respect to internal BMU 170-1. Thus, EC processor 182 may have access to EC memory 184, which may store EC firmware 186, representing instructions executable by EC processor 182.

In some embodiments, EC firmware 186 may include pre-boot instructions executable by EC processor 182. For example, EC firmware 186 may be operable to prepare information handling system 100 to boot by activating various hardware components in preparation of launching an operating system for execution. Accordingly, in some embodiments, EC firmware 186 may include a basic input/ output system (BIOS). In certain embodiments, EC firmware 186 includes a Unified Extensible Firmware Interface (UEFI) according to a specification promulgated by the UEFI Forum (uefi.org). Embedded controller 180 may execute EC firmware 186 on EC processor 182 even when other components in information handling system 100 are inoperable or are powered down. Furthermore, EC firmware 186 may be in control of EC communication interface(s) 188, which may represent one or more input/output interfaces or signals that embedded controller 180 can use to communicate with other elements of information handling system 100, such as processor subsystem 120 or I/O subsystem 140, among others.

Also shown within embedded controller 180 is power control 148, which may be responsible for managing electrical power connections between power storage adapter 172, internal BMU 170-1, and to portable information handling system 100. In some embodiments, power control 148 may be implemented as a separate controller external to embedded controller 180. For example, when variable power bus 142 supplies electrical power to portable information handling system 100, power control 148 may determine whether the electrical power is used to charge internal battery 171 or to directly power portable information handling system 100. Power control 148 may also manage so-called 'soft start up' of portable information handling system 100, such as when portable information handling system 100 awakes from a low power state, such as sleep mode, by determining a source of power during the low power state and managing operation of portable information handling system 100 during the low power state. Power control 148 may accordingly route electrical power and communicate with internal BMU 170-1 via DC power and control 144, which may represent suitable connections between embedded controller 180 and internal BMU 170-1, for example. It is noted that in some embodiments, at least certain portions of power control 148 may be implemented using EC firmware 186, such as specialized executable instructions for power management and control.

In particular embodiments, embedded controller 180 may support a variable power bus 142, which may represent a data bus that also carries and distributes electrical power to and from portable information handling system 100. In various embodiments, variable power bus 142 supports different levels of direct-current (DC) power that may be provided to certain peripherals connected to I/O subsystem 140. In particular embodiments, variable power bus 142 may be used to receive DC power from an external source, such as a power storage adapter 172. For example, the DC power received from the external source may be routed via DC power connection 144 to internal BMU 170-1 for purposes of charging internal battery 171 or otherwise powering portable information handling system 100.

In certain embodiments, variable power bus 142 is implemented according to an industry standard, such as a Universal Serial Bus (USB), which is developed and supported by the USB Implementers Forum, Inc. (USB IF, www.usb.org). In particular, variable power bus 142 may be implemented as a USB Type-C bus that may support different USB devices, such as USB Type-C devices with USB Type-C connectors. Accordingly, variable power bus 142 may support device detection, interface configuration, communication, and power delivery mechanisms according to the USB Type-C standard. The USB Type-C connector system allows the transport of data and electrical power (in the form of DC power) between various USB devices that are connected using USB Type-C ports and USB Type-C connectors. A USB device may be an information handling system, a peripheral device, a power device, among other types of USB devices, and may support more than one USB standard or generation, such as USB 1.0, USB 2.0, USB 3.0, USB 3.1, or other versions. Furthermore, USB devices may also support one or more types of physical USB ports and corresponding connectors (i.e., receptacles and plugs), such as Type-A, Type-A SuperSpeed, Type-B, Type-B SuperSpeed, Mini-A, Mini-B, Micro-A, Micro-B, Micro-B SuperSpeed, and Type-C (also referred to as USB Type-C herein), among other variants. In one example, USB 3.1 Type-C cables may provide electronic functionality using an integrated semiconductor device with an identification function based on a configuration data channel and vendor-defined messages (VDMs) from a USB Power Delivery specification published by USB IF (http://www.usb.org/developers/powerdelivery/). Examples of source power rules governed by the USB Power Delivery Specification, revision 2.0, version 1.2 are given in Table 1 below.

TABLE 1

| USB Power Delivery revision 2.0, version 1.2 source power rules. | | | | |
|---|---|---|---|---|
| Source Output Power [W] | Current [A] at +5 V DC | Current [A] at +9 V DC | Current [A] at +15 V DC | Current [A] at +20 V DC |
| 0.5 to 15 | 0.1 to 3.0 | none | none | none |
| 15 to 27 | 3.0 (15 W limit) | 1.7 to 3.0 | none | none |
| 27 to 45 | 3.0 (15 W limit) | 3.0 (27 W limit) | 1.8 to 3.0 | none |
| 45 to 60 | 3.0 (15 W limit) | 3.0 (27 W limit) | 3.0 (45 W limit) | 2.25 to 3.0 |
| 60 to 100 | 3.0 (15 W limit) | 3.0 (27 W limit) | 3.0 (45 W limit) | 3.0 to 5.0 |

As shown in Table 1, USB Power Delivery defines four standardized voltage levels (+5V DC, +9V DC, +15V DC, and +20V DC), while power supplies may provide electrical power from 0.5 W to 100 W.

A USB device, such as a USB Type-C device, may provide multiple power ports that can individually transfer power in either direction and may accordingly be able to operate as a power source device, a power sink device, or both (dual-role power device). A USB device operating as a dual-role power device may operate as a power source or a power sink depending on what kinds of other USB devices are connected. In addition, each of the multiple power ports provided by the USB device may be a dual-role power port that is able to operate as either a power source port or a power sink port. For example, a USB Type-C bus, such as variable power bus 142, may support power delivery from a power source port of a power source USB device to a power sink port of a power sink USB device, while simultaneously supporting bidirectional USB data transport. The power source port of the power source USB device and the power sink port of the power sink USB device form a power port pair. Each of the other power ports provided by the USB device may form other power port pairs of other USB dual-role power devices.

According to the USB Power Delivery Specification, USB Type-C devices may perform a negotiation process to negotiate and establish a power contract for a particular power port pair that specifies a level of DC power that is transferred using USB. For example, a USB Type-C device may negotiate a power contract with another USB device for a level of DC power that is supported by a power port pair of both devices, where one power port is a power source port of the USB Type-C device and the other power port is a power sink port of the other USB device. The power contract for power delivery and consumption may represent an agreement reached between the power source device and the power sink device for the power port pair. While operating in Power Delivery mode, the power contract for the power port pair will generally remain in effect unless altered by a re-negotiation process, a USB soft reset, a USB hard reset, a removal of power by a power source, a failure of the power source, or a USB role swap (such as between power source and power sink devices), as specified in detail by USB IF. When a particular power contract is in place, additional power contracts can be established between another power port of the power source device and a power port of another power sink device.

According to the USB Power Delivery specification, the negotiation process may begin with the power source device detecting an attachment of a USB device operating as a power sink to a power port of the power source device. In response to the detection of the attachment at the respective USB ports, the power source device may communicate a set of supported capabilities including power levels, voltage levels, current levels, and direction of power flow of the power port of the power source device by sending the set of supported capabilities to the power sink over the USB connection. In response to receiving the set of supported capabilities, the power sink device may request one of the communicated capabilities by sending a request message to the power source device. In response to receiving the request message, the power source device may accept the request by sending an accept message and by establishing a power source output corresponding to the request. The power contract for the power port pair may be considered established and in effect when the power source device sends the accept message to the power sink device, which ends the negotiation process. A re-negotiation process may occur in a similar manner when a power contract is already in effect.

During the negotiation process, a power sink USB device that may be unable to fully operate at any of the communicated capabilities may request a default capability but indicate that the power sink USB device would prefer another power level. In response to receiving the default capability request, the power source device may accept the default capability request by storing the power sink USB device's preferred power level, sending an accept message, and by establishing a power source output corresponding to the default capability request.

During the various negotiation processes described above for USB Power Delivery, the negotiation may fail when a request is not accepted, and may result in no power contract being established. For example, the power sink USB device and the power source USB device may have timeouts for pending requests, or other communications, to a respective counterparty. When a counterparty does not respond within the timeout, a pending request or other communication may fail. It is also noted that in some embodiments, a power delivery contract for zero electrical power may be established, such that no power is transferred but the power port pair remains connected over the USB connection.

As illustrated in FIG. 1, each of portable information handling system 100 and power storage adapter 172 may include a battery management unit (BMU) 170 that controls operation of a respective battery. In particular implementations, BMU 170 may be embedded within a respective battery whose operation BMU 170 controls. For example, internal BMU 170-1 within portable information handling system 100 may control operation of an internal battery 171, while PSA BMU 170-2 within power storage adapter 172 may control operation of a PSA battery 174. More specifically, BMU 170-1 may monitor information associated with, and control charging operations of, internal battery 171, while BMU 170-2 may monitor information associated with, and control charging operations of, PSA battery 174. In operation, each BMU 170 may control operation of a respective battery to enable sustained operation, such as by protecting the battery. Protection of the battery by BMU 170 may comprise preventing the battery from operating outside of safe operating conditions, which may be defined in terms of certain allowable voltage and current ranges over which the battery can be expected to operate without causing self-damage. For example, the BMU 170 may modify various parameters in order to prevent an over-current condition (whether in a charging or discharging mode), an over-voltage condition during charging, an under-voltage condition while discharging, or an over-temperature condition, among other potentially damaging conditions.

As used herein, "top-of-charge voltage" (or "TOC" voltage) refers to a voltage threshold used during a charge cycle of a battery to determine a 100% charge level. It is noted that the top-of-charge voltage set on a given battery may be lower than a "maximum charge voltage", which may specify a maximum voltage that a given battery having a given battery chemistry can safely endure during charging without damage. As used herein, the terms "state of charge", "SOC", or "charge level" refer to an actual charge level of a battery, from 0% to 100%, for example, based on the currently applied top-of-charge voltage. The SOC may be correlated to an actual voltage level of the battery, for example, depending on a particular battery chemistry.

In some embodiments, a battery (such as internal battery 171 or PSA battery 174 illustrated in FIG. 1) may be considered to be discharged when an SOC of the battery corresponds to an SOC that is below a predetermined threshold percentage or amount below the 100% charge level given by the TOC voltage, such as below a 5% charge level in one example. A battery may be considered to be charged, i.e., at least partially charged, when the SOC for the battery corresponds to an SOC that is above a first predetermined threshold percentage or amount below the 100% charge level given by the TOC voltage, such as above the 25% charge level in one example. A battery may be considered to be fully charged when the SOC of the battery corresponds to an SOC that is above a second predetermined threshold percentage or amount below the 100% charge level given by the TOC voltage, such as above the 95% charge level for example. A battery may be considered to be at least partially discharged when the SOC of the battery corresponds to an SOC that is below the 100% charge level. The parameters for specifying an SOC described above are examples and may be modified using different values in different embodiments.

In various embodiments, a battery (such as internal battery 171 or PSA battery 174 illustrated in FIG. 1) may include one or more cells having a particular chemistry in a particular cell configuration. For example, in one embodiment, the battery may include four Lithium-ion cells in a two parallel-two serial (2S-2P) configuration. In other embodiments, the battery may include a different number of cells or may include multiple cells in a different configuration. For example, the battery may include three or more cells in various configurations. In some embodiments, the battery may include one or more cells based on any one of a variety of lithium-ion electrochemistries, or one or more cells based a different electrochemistry than lithium-ion.

As shown in FIG. 1, power storage adapter 172 may be designed to removably couple to portable information handling system 100 using variable power bus 142. For example, variable power bus 142 may include power connections for electrically coupling power storage adapter 172 to portable information handling system 100 as an external load on power storage adapter 172. Variable power bus 142 may also include a communication link to enable power storage adapter 172 to communicate with portable information handling system 100, such as via embedded controller 180. For example, power storage adapter 172 may communicate battery data collected locally at power storage adapter 172 to portable information handling system 100 over a communication link within variable power bus 142. In other embodiments, there may be a communication link between power storage adapter 172 and portable information handling system 100 that is separate from variable power bus 142 instead of, or in addition to, a communication link that is part of variable power bus 142. In some embodiments, a communication link between power storage adapter 172 and portable information handling system 100, or DC power and control 144, may operate in accordance with a System Management Bus (SMBus) protocol for sending and receiving data. As noted above, in particular embodiments, variable power bus 142 is compatible with USB Type-C and may be implemented according to USB Type-C and USB Power Delivery specifications promulgated by USB IF.

In various embodiments, each of internal battery 171 or PSA battery 174 may include at least certain portions of a main power circuit across positive and negative terminals, a current sensor, a voltage sensor, one or more battery cells, a fuse, and a power switch (not shown). The current sensor may represent a shunt resistor, or other current sensing element, over which a voltage that is directly proportional to the current flowing through the main power circuit is measured. The battery cells may store and output electrical energy based on a given electrochemical composition internal to the battery cells. The voltage sensor may enable voltage measurement of individual battery cells, or measurement of an aggregate voltage for the battery including all battery cells operating together. The temperature sensor may be located in proximity to the battery cells to provide an accurate indication of a temperature within the battery. The fuse may be a safety element for limiting current flowing through the main power circuit. The power switch may be an electronically controlled switching element that closes or opens the main power circuit, and thereby allows the battery to operate for charging or discharging.

In FIG. 1, each BMU 170 may include a charging unit (see FIG. 2, charging unit 246) that may control charging cycles for a battery and may apply a TOC voltage as a threshold to determine when charging is complete as the battery voltage increases during charging. The TOC voltage may be lower than or equal to the maximum charge voltage that the battery can physically sustain, in different embodiments. Depending on the actual value for the TOC voltage, a given energy capacity may be stored using the battery. BMU 170 may also be enabled to obtain various types of information associated with a battery and to make decisions according to the obtained information. For example, each BMU 170 may monitor various charging-related parameters or other operating parameters received from one or more batteries, including parameters received from a local battery or parameters received from a remote battery over variable power bus 142.

In some embodiments, parameters monitored by a BMU 170 may include a charging current, a voltage, and a temperature associated with a battery. More specifically, the parameters monitored by the BMU 170 may include any or all of the cell configuration and chemistry of battery cells within the battery, the total voltage of the battery, the voltages of individual battery cells, minimum or maximum cell voltages, the average temperature of the battery as a whole, the temperatures of individual battery cells, the SOC of the battery, the depth of discharge of the battery, the current flowing into the battery, the current flowing out of the battery, and any other measurement of the overall condition of the battery, in various embodiments. In some embodiments, monitoring the SOC may include continuous or periodic monitoring of battery output current, voltage, or both. In some cases, Coulomb counting, in which the charge delivered or stored by a battery is tracked, is used for battery monitoring. In some embodiments, a battery temperature may be monitored through the use of periodic voltage measurements, a thermometer, or any other method to detect or correct for variations in temperature. In some embodiments, at least some of the parameters monitored by BMU 170 may be used internally by BMU 170 for internal battery management operations. In some embodiments, at least some of the parameters monitored by BMU 170 may be provided to another device, such as information associated with PSA battery 174 that is provided to or obtained by PSA BMU 170-2 on power storage adapter 172, and which may be provided to portable information handling system 100 over variable power bus 142.

In some embodiments, BMU 170 may calculate additional values, based on the monitored battery parameters or other information obtained from a battery, for example, in order to make decisions related to the charging and operation of the battery. For example, BMU 170 may calculate any or all of a charge current limit (CCL), a discharge current limit (DCL), a total amount of energy delivered, an amount of energy delivered since the last charge, an amount of charge delivered or stored, a number of charging cycles, a total operating time, and an operating time since the last charge. In some embodiments, BMU 170, or another component of portable information handling system 100 or power storage adapter 172, may analyze and compare monitored parameter values to historic values or predicted models relative to an SOC of the battery, and may calculate the remaining battery life. Remaining battery life may refer to a duration or a fraction of a time period remaining that a battery may safely provide electrical power, an amount or a fraction of a voltage drop remaining over which a battery may safely provide electrical power, or an amount or fraction of a discharge capacity remaining that a battery may safely provide electrical power. Based on the obtained and calculated values, BMU 170 may detect various alert conditions associated with a battery, conditions such as battery charge full, battery charge empty, battery charging, battery discharging, battery over temperature, battery over current, other battery system status conditions, or various combinations thereof. In some embodiments, information indicating an alert condition for PSA battery 174 that is detected by PSA BMU 170-2 on power storage adapter 172 may be provided to portable information handling system 100 over variable power bus 142.

In various embodiments, BMU 170 may further include a DC boost converter (see FIG. 2, DC boost converter 248) that is capable of boosting the voltage provided by the cells within a battery. The DC boost converter may be externally controlled to provide a desired boost voltage output from the battery, such as in response to a control signal or other trigger condition. Because the internal output voltage of the battery may be constrained by the particular battery electrochemistry used to implement the cells, the DC boost converter may enable the battery to output a higher voltage, as desired. In some embodiments, the DC boost converter may be a buck-boost type converter that can step up or step down an input DC voltage.

In some embodiments, embedded controller 180 may implement a voltage control module that senses the current drawn by an electrical load and provides a control signal to BMU 170-1 based on the current drawn by the electrical load. For example, the voltage control module may be implemented as executable code stored by EC memory 184, while the electrical load may be information handling system 100, or portions thereof. It may be advantageous, for example, to provide a higher voltage to the electrical load in order to minimize the power dissipated by losses incurred in transmitting current from internal battery 171 to the electrical load. In another embodiment, the voltage control module may provide control signals in response to a voltage set signal. The voltage set signal may instruct the voltage control module to control BMU 170-1 to produce a particular voltage at the load. For example, the particular voltage level may allow the load to operate in a desired mode of operation. In one embodiment, the particular voltage level indicated by the voltage set signal may be higher than the voltage output by cells within a battery. BMU 170-1 may boost the voltage output by the cells to the voltage indicated by the voltage set signal.

For example, in some embodiments, a battery (such as internal battery 171 or PSA battery 174 illustrated in FIG. 1) may provide electrical power to the information handling system 100 at an output voltage controlled by its respective BMU 170. In some cases, portable information handling system 100 may provide load state information to the voltage control module. In some embodiments, the load state information may be based on the operating mode of the load, or on a desired future operating mode of the load. The voltage control module may determine a voltage level based on the load state information, and may provide voltage control information based on the determined voltage level to internal BMU 170-1 or PSA BMU 170-2. In one embodiment, voltage control information provided to PSA BMU 170-2 may specify the output voltage level of power storage adapter 172. In another embodiment, voltage control information provided to PSA BMU 170-2 may indicate a preferred voltage range for the output voltage level of power storage adapter 172. In yet another embodiment, voltage control information provided to PSA BMU 170-2 may indicate that the output voltage level of power storage adapter 172 should be increased or should be decreased.

In certain embodiments, BMU 170 may include a processor and memory (not shown). The memory may store instructions executable by the processor to perform methods for obtaining and calculating values related to the operation and charging of a battery and for controlling the operation and charging of the battery. The memory may also store data, obtained and calculated values, thresholds, and parameters.

Figure 2:
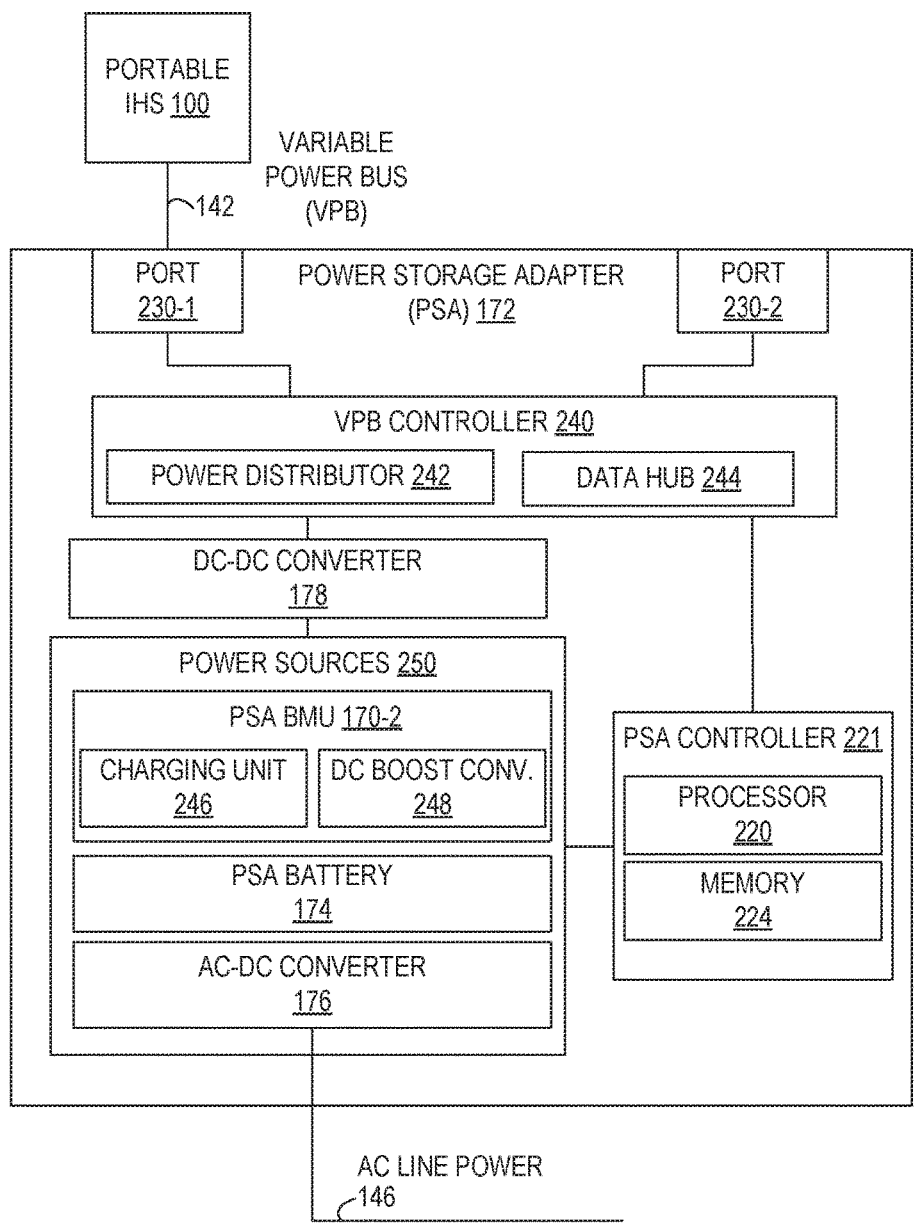
FIG. 2 is a block diagram of selected elements of a portable information handling system with an external power storage adapter.

In FIG. 1, power storage adapter 172 is shown receiving AC line power 146 as an external power source. AC line power 146 may represent a connection to line power, such as using a standard line power cable. In some embodiments, AC line power 146 may be a removable connection, such as a cable that plugs into line power in a wall socket, and plugs into a corresponding receptacle included with power storage adapter 172. Also included within power storage adapter 172 in FIG. 2 is AC-DC converter 176. AC-DC converter 176 may receive alternating current (AC) from AC line power 146 and may output one or more DC voltages for supplying electrical power to other components in power storage adapter 172. For example, an output DC voltage from AC-DC converter 176 may be supplied to PSA battery 174 for charging purposes. An output DC voltage from AC-DC converter 176 may be supplied to a DC-DC converter 178, which may then generate one or more other DC voltages. Also, an output DC voltage from AC-DC converter 176 may be directly supplied to variable power bus 142, such as to fulfil a power contract, as described above. Additional details of power storage adapter 172 are described below with respect to FIG. 2.

As will be described in further detail herein, power storage adapter 172 may include a multilayered printed circuit board (PCB) having a power field effect transistor (FET) that may generate heat. The power FET is expected to generate a substantial amount of heat among the components of power storage adapter 172 and may serve as an internal heat source in operation. A significant amount of energy may flow through the power FET, which may become very warm or hot as a result. The power FET may also be a small device and a temperature of the power FET may be ratio-metric (or proportional) to an amount of energy that may flow through the power FET and a size of the power FET, which may result in a high thermal density associated with the power FET. Because of the small size of the power FET, the power FET may not be able to dissipate heat that is generated in operation. Therefore, the power FET may dissipate heat in other ways. Typically, a metal moat, which may be copper, may be utilized to dissipate heat generated by the power FET. In one example, a size of the power FET may be about 5 by 6 mm in area and about 1.2 mm in height, while the power FET may transmit about 30 W of energy. As a result, a temperature of the power FET may rise significantly and may exceed a desired operational temperature. For example, a temperature of 130° C. for a silica nitride FET and 150° C. for a gallium nitride (GaN) FET may exceed the desired operational temperature and may result in failure. For the dimensions in the previous example, the power FET may utilize a one inch square copper moat to dissipate the heat at a first heat dissipation rate that may avoid an undesired rise in temperature. The size of the copper moat may be based on thermal resistance of the power FET. The thermal resistance of the power FET may be given by a difference in temperature between the power FET and ambient temperature divided by a heat of the power FET to be dissipated at the copper moat. A copper moat of about 2.37 in$^2$ may dissipate about 1 W for about a 40° rise in temperature. The size of the copper moat may increase a size of the multilayer PCB and an overall size of power storage adapter 172, which may be undesirable.

In order to maintain an overall compact size of power storage adapter 172, which is desirable, the power FET may utilize a transformer of power storage adapter 172 as a thermal radiator to dissipate heat generated by the power FET. The transformer may include windings that may be thermally coupled to a radiant heat exchanger associated with the power FET. The power FET may be thermally coupled to the windings of the transformer and may utilize the radiant heat exchanger to dissipate heat generated by the power FET at a second heat dissipation rate. The second heat dissipation rate may be greater than the first heat dissipation rate, which may allow the radiant heat exchanger to more efficiently dissipate heat. Using the radiant heat exchanger of the transformer to dissipate heat generated by the power FET at the second heat dissipation rate may allow a temperature of the power FET to be maintained within the desired operational temperature and may utilize an area of the multilayer PCB about one fifth the size of the copper moat. For example, when AC-DC converter 176 of power storage adapter 172 converts an AC voltage to a DC voltage using the power FET and the transformer, the power FET may generate heat. The power FET and the windings of the transformer, as described herein, may operate to transfer heat from the power FET to the radiant heat exchanger, and may more efficiently distribute and dissipate heat within power storage adapter 172, which may be a compact device having various electrical components housed within a relatively small volume.

Although the operation of the power FET and the transformer is described herein with respect to power storage adapter 172, it will be understood that the power FET and the transformer disclosed herein may be used in a variety of other power adapter devices, including a power storage adapter, a power adapter with power storage, a power adapter without power storage, a power storage unit, an uninterruptable power storage unit, and another type of power adapter device. Accordingly, the power FET and the transformer may be selected for various physical arrangements and thermal loads in different types of devices and information handling systems.

Referring now to FIG. 2, selected elements of an embodiment of a system 200 with portable information handling system 100 and power storage adapter 172 are shown. FIG. 2 illustrates further internal details of power storage adapter 172. It is noted that FIG. 2 is not drawn to scale but is a schematic illustration. In various embodiments, power storage adapter 172 may be implemented using fewer or additional components than illustrated in FIG. 2.

In FIG. 2, power storage adapter 172 is coupled to portable information handling system 100 via variable power bus (VPB) 142, as described above with respect to FIG. 1. Additionally, power storage adapter 172 is also externally connected to AC line power 146, as described above with respect to FIG. 1.

As shown in FIG. 2, power storage adapter 172 includes power sources 250, a DC-DC converter 178, a VPB controller 240, and two ports 230, as well as a PSA controller 221 comprising processor 220 and memory 224. As shown, power sources 250 comprise an AC-DC converter 176, a PSA battery 174, and a PSA BMU 170-2. In FIG. 2, PSA BMU 170-2 is shown including a charging unit 246 and a DC boost converter 248, while VPB controller 240 is shown including a power distributor 242 and a data hub 244. In some embodiments, DC boost converter 248 may include buck-boost DC conversion functionality to step up or step down an input DC voltage. VBP controller 240 is depicted in FIG. 2 in an implementation with two ports 230-1 and 230-2 that support variable power bus 142. As noted above, variable power bus 142 may be compatible with USB Type-C specifications promulgated by USB IF. Accordingly, in particular embodiments, port 230-1 may be a USB Type-C port. In different embodiments, port 230-1 may also be a USB Type-C port or another type of port, such as a USB Type-A port, among others. Although two ports 230 are shown in the example embodiment of FIG. 2, it will be understood that power storage adapter 172 may include fewer or more ports 230 in different embodiments.

As shown in FIG. 2, power storage adapter 172 includes PSA controller 221, which may perform various actions and functions. In some embodiments, PSA controller 221 is implemented using a custom integrated circuit, or a customizable integrated circuit, such as a field programmable gate array (FPGA). In the embodiment shown in FIG. 2, PSA controller 221 includes processor 220 and memory 224, which may store executable instructions (such as executable code) that may be executed by processor 220, which has access to memory 224. Processor 220 is typically implemented as an integrated circuit, such as a microprocessor or microcontroller, and is enabled to execute instructions that cause power storage adapter 172 to perform the functions and operations described herein. For the purposes of this disclosure, memory 224 may include non-transitory computer-readable media that stores data and instructions for at least a period of time. Memory 224 may comprise persistent and volatile media, fixed and removable media, and magnetic and semiconductor media. Memory 224 may include, without limitation, storage media such as a direct access storage device (e.g., a hard disk drive or floppy disk), a sequential access storage device (e.g., a tape disk drive), compact disk (CD), random access memory (RAM), read-only memory (ROM), CD-ROM, digital versatile disc (DVD), electrically erasable programmable read-only memory (EEPROM) or flash memory, non-transitory media, or various combinations of the foregoing. Memory 224 is operable to store instructions, data, or both. Memory 224 may store sets or sequences of instructions that may represent executable computer programs for implementing various functionality provided by power storage adapter 172.

The functionality and implementation details of certain elements in power storage adapter 172, such as AC-DC converter 176, PSA battery 174, PSA BMU 170-2, and DC-DC converter 178, are described above with respect to FIG. 1.

As shown, VPB controller 240 may include power distributor 242, which may represent various electronic components that enable distribution of DC power with respect to variable power bus 142 via ports 230. Specifically, power distributor 242 may receive at least one DC power input from DC-DC converter 178. Power distributor 242 may route or switch power connections to respective ports 230, for example, to enable fulfillment of a power contract, as described above. A power contract established by VPB controller 240, such as according to a USB Power Delivery Specification, may govern the supply of DC power to portable information handling system 100 via port 230-1. VPB controller 240 may also establish another power contract to supply DC power to another device coupled to port 230-2. In some embodiments, VPB controller 240 supplies DC power to both port 230-1 and port 230-2. Power distributor 242 may supply different DC voltages for output power at different ports 230. In particular embodiments, power distributor 242 supplies a different DC voltage to port 230-1 than to port 230-2.

In FIG. 2, data hub 244 may represent electronic functionality to manage various VPB connections over variable power bus 142. Specifically, data hub 244 may control operation of power distributor 242 and may, in turn, be controlled by PSA controller 221, such as by executable code (not shown) stored in memory 224 and executed by processor 220. Additionally, data hub 244 may store state information for each respective port 230, such as USB state information. For example, data hub 244 may store information associated with power contracts that power storage adapter 172 has established or is in the process of negotiating. Accordingly, data hub 244 may store various information about different VPB devices connected to power storage adapter 172 via ports 230. As used herein, the phrase "power consuming device" may refer to any system, apparatus, or device consuming the electrical power provided by a battery. For example, a portable information handling system may consume power for components such as one or more displays, processors, storage media, memory, or other components.

In the illustrated embodiment, charging unit 246 of BMU 170-2 may draw electrical power from AC-DC converter 176, and may, in turn output a charging voltage and charging current suitable to charge the cells of PSA battery 174. The charging voltage and the charging current demands of the battery may be dependent on an electrochemistry or a cell configuration of the battery cells. The charging of the battery may be limited by the current supply capability of the DC source. In some embodiments, the DC source may be AC-DC converter 176. Once the battery reaches 100% state of charge, BMU 170-2 may stop drawing current from the AC-DC converter 176. When a boost source of power is desired, charging unit 246 may also be enabled to supply electrical from PSA battery 174, which is then boosted to a desired output voltage by DC boost converter 248.

In some embodiments, portable information handling system 100 may communicate with power storage adapter 172 to instruct PSA BMU 170-2 to charge the battery cells of PSA battery 174. As previously noted, PSA BMU 170-2 may send information to portable information handling system 100, such as the cell configuration, the state of charge of the battery, or other information. Portable information handling system 100 may communicate with PSA BMU 170-2 using a system management bus (not shown), for example System Management Bus (SMBus) promulgated by SBS Implementers Forum (www.smbus.org), in some embodiments.

Figure 3:
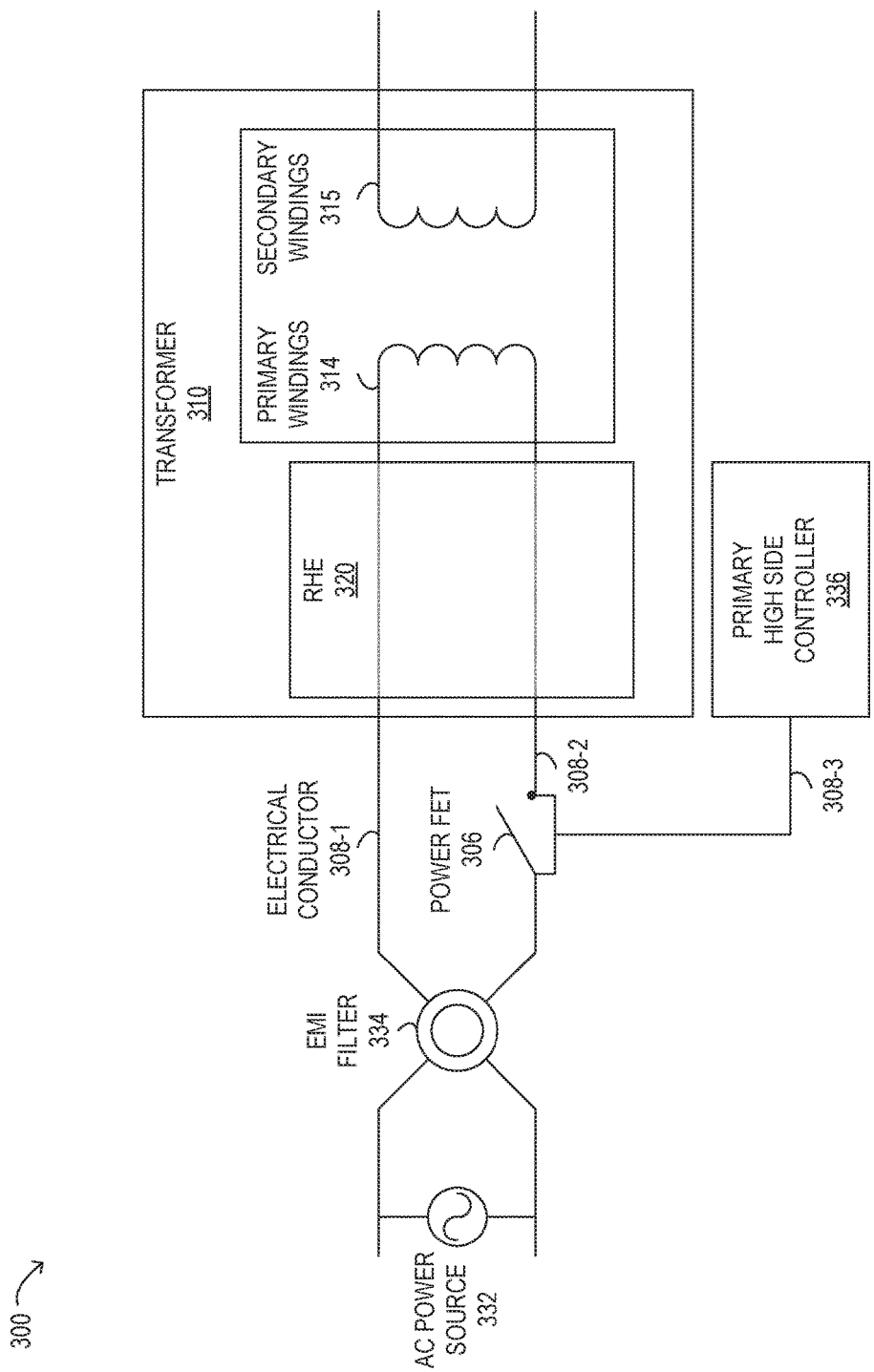
FIG. 3 is a block diagram of selected elements of an electrical circuit including a transformer having a transformer thermal radiator for power FETs of a power storage adapter.

Referring now to FIG. 3, selected elements of an embodiment of an electrical circuit 300 including a transformer having a transformer thermal radiator for power FETs of power storage adapter 172 are shown. It is noted that FIG. 3 is not drawn to scale but is a schematic illustration. In various embodiments, electrical circuit 300 may be implemented using fewer or additional components than illustrated in FIG. 3.

As shown in FIG. 3, electrical circuit 300 includes an alternating current (AC) power source 332, an electromagnetic interference (EMI) filter 334, a power field effect transistor (FET) 306, electrical conductors 308-1, 308-2, and 308-3, a transformer 310, and a primary high side controller 336. Transformer 310 includes primary windings 314, secondary windings 315, and a radiant heat exchanger 320. AC power source 332 may be AC line power 146 coupled to AC-DC converter 176, as described above with respect to FIG. 1. AC power source 332 may vary between a high AC voltage value and a low AC voltage value. For example, AC power source 332 may vary between 90 and 265 volts AC. EMI filter 334 may reduce EMI, such as, for example, EMI of AC power source 332. EMI filter 334 may include at least one of a bypass capacitor, and a decoupling capacitor. Power FET 306 may further comprise a gallium nitride (GaN) FET, a gate all around (GAA) FET, or another type of power FET.

Power FET 306 is expected to generate a substantial amount of heat and may serve as an internal heat source in operation. Radiant heat exchanger 320 may be associated with power FET 306. Radiant heat exchanger 320 may comprise at least one of a copper moat, fins, a fin stack, a plate, a radiant cooler, a copper finger thermally coupled to an electromagnetic interference (EMI) shield. Radiant heat exchanger 320 may comprise at least one of copper, graphene, graphite, aluminum nitride, an aluminum alloy, silicon carbide, and silicon nitride.

In FIG. 3, Power FET 306 may be electrically coupled to AC power source 332 at a first input node via EMI filter 334 and coupled to primary windings 314 at a first output node via electrical conductor 308-1, and electrical conductor 308-2 coupled to primary windings 314 and to AC power source 332. Power FET 306 may also be electrically coupled to primary high side controller 336 at a second input node via electrical conductor 308-3. Electrical conductors 308-1 and 308-2 may form a heat transfer path between power FET 306 and transformer 310. During operation, electrical conductors 308-1 and 308-2 may conduct AC current between power FET 306 and primary windings 314, which results in power passing through power FET 306. The power passing through power FET 306 may be, for example, 45 W, 65 W, or 90 W, which may result in a temperature of power FET 306 rising to a first temperature. When the first temperature of power FET 306 is greater than a second temperature of transformer 310, heat may flow via the heat transfer path to transformer 310. Transformer 310 may be cooled by radiant heat exchanger 320, and the first temperature of power FET 306 may be maintained below a maximum value when power FET 306 is in operation. Power FET 306 may be operated using only the heat transfer path for cooling power FET 306.

Figure 4A:
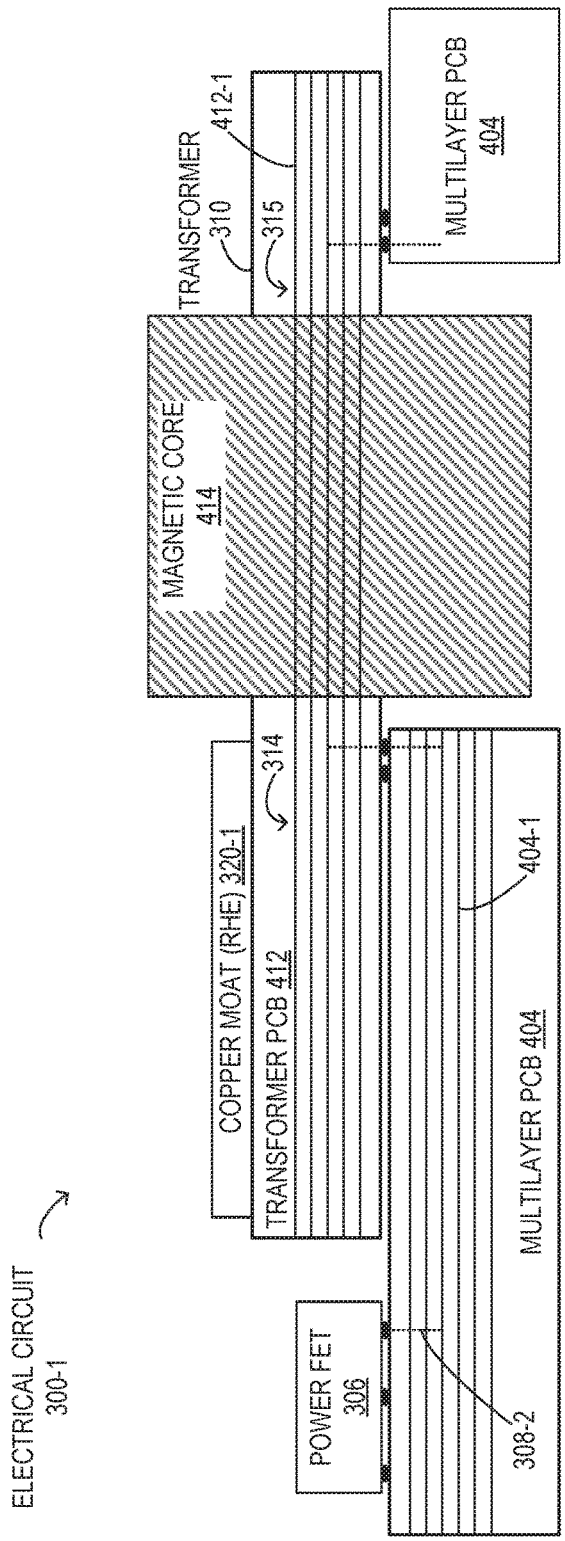
FIGS. 4A, 4B, 4C, and 4D are schematic representations of the cross section of exemplary implementations of the electrical circuit of FIG. 3.

Referring now to FIG. 4A, an exemplary implementation of electrical circuit 300-1 is shown. It is noted that FIG. 4A is not drawn to scale but is a schematic representation of the cross section of electrical circuit 300 of FIG. 3, in which certain details and connections are not visible for descriptive purposes. In various embodiments, electrical circuit 300 may be implemented using fewer or additional components than illustrated in FIG. 4A.

In FIG. 4A, electrical circuit 300-1 may include a multilayer printed circuit board (PCB) 404 including PCB traces 404-1, power FET 306, and transformer 310. Transformer 310 may include a transformer PCB 412 including PCB traces 412-1, primary windings 314, and secondary windings 315, a copper moat (RHE) 320-1 associated with power FET 306, and a magnetic core 414. Magnetic core 414 may comprise magnetic ferrite material.

Multilayer PCB 404 mechanically supports and electrically connects components of electrical circuit 300-1 using conductive traces, pads, and other features etched from copper sheets laminated onto a non-conductive substrate. Multilayer PCB 404 may include a non-conductive fiberglass layer on the top and the bottom with at least one copper layer in between the fiberglass layers. The components may be mounted on multilayer PCB 404 and/or may be embedded within one or more layers of multilayer PCB 404. Conductive traces may be on different layers of multilayer PCB 404 and may be connected with VIAs. Similarly, transformer PCB 412 may be a multilayer PCB that mechanically supports and electrically connects components of transformer 310 using conductive traces, pads, and other features etched from copper sheets laminated onto a non-conductive substrate. Transformer PCB 412 may include a non-conductive fiberglass layer on the top and the bottom with at least one copper layer in between the fiberglass layers. The components may be mounted on transformer PCB 412 and or may be embedded within one or more layers of Transformer PCB 412. Transformer PCB 412 may be mounted on multilayer PCB 404 and certain components mounted on or embedded within multilayer PCB 404 may be electrically connected to certain other components mounted on or embedded within transformer PCB 412 using conductive traces, pads, and other features of multilayer PCB 404 and transformer PCB 412.

Electrical conductor 308-2 may be implemented using vias, PCB traces 404-1, and PCB traces 412-1, where PCB traces 404-1 and PCB traces 412-1 are patterned according to a desired circuit layout (not shown). Electrical conductor 308-2 may be formed using one or more layers of PCB traces 404-1. Electrical conductor 308-1 is formed in a similar manner but is obstructed from view in FIG. 4A. Each of electrical conductors 308-1 and 308-2 may further be comprised of a metal, such as copper, aluminum, or another type of metal. Electrical conductors 308-1 and 308-2 may accordingly transmit electrical current between power FET 306 and primary windings 314 of transformer 310.

Transformer 310 may be a planar transformer including a windings structure of primary windings 314 and secondary windings 315, which may be a series of planar windings forming primary windings 314 and secondary windings 315 within transformer PCB 412. For example, transformer PCB 412 may be an eight layer PCB and the series of planar windings may be formed within the eight layers. Transformer 310 may be 3-dimensional in shape and may have a relatively large mass and therefore, a relatively high heat capacity, as compared to power FET 306.

Power FET 306 is expected to generate a substantial amount and may serve as an internal heat source in operation. Power FET 306 may utilize copper moat 320-1 to dissipate heat generated by power FET 306. Copper moat 320-1 may be in an area formed in a top layer of transformer PCB 412. Utilizing copper moat 320-1 to dissipate heat generated by power FET 306 may eliminate the need for a copper moat in multilayer PCB 404 to dissipate the heat generated by power FET 306 or allow a copper moat in multilayer PCB 404 to be significantly smaller in size. As such, the size of multilayer PCB 404 may be reduced and power FET 306 may be moved closer in proximity to transformer 310.

Figure 4B:
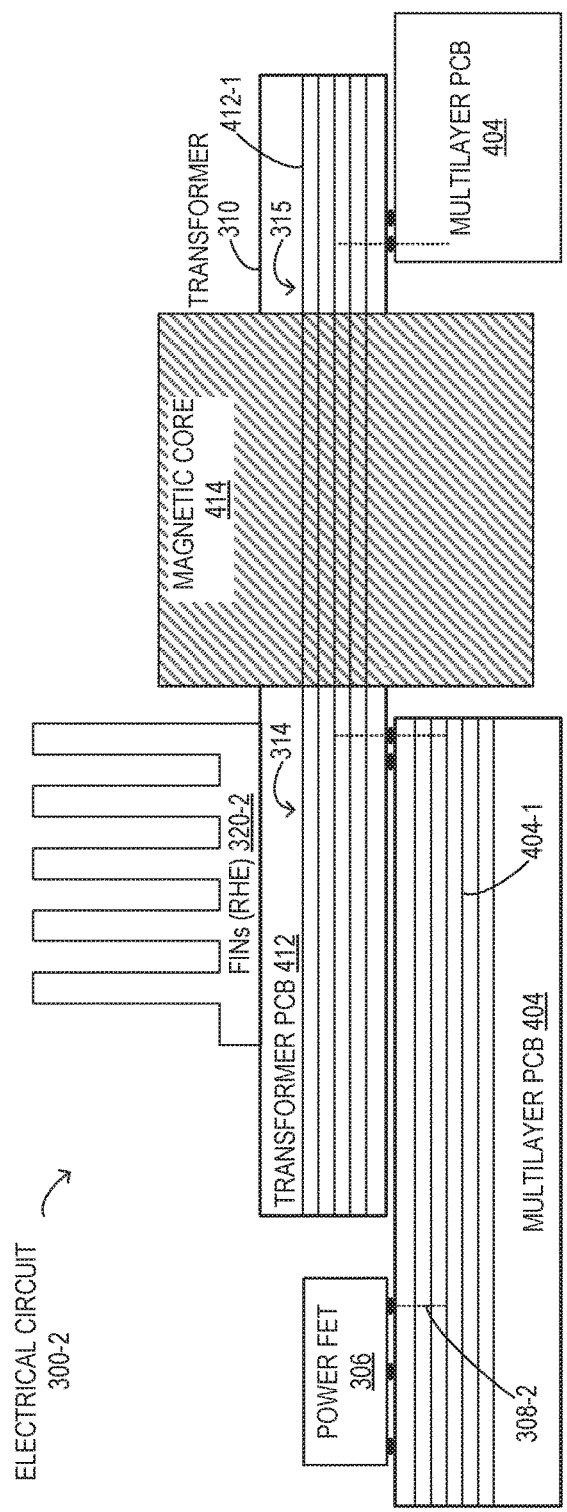

Referring now to FIG. 4B, an exemplary implementation of electrical circuit 300-2 is shown. It is noted that FIG. 4B is not drawn to scale but is a schematic representation of the cross section of electrical circuit 300 of FIG. 3, in which certain details and connections are not visible for descriptive purposes. In various embodiments, electrical circuit 300 may be implemented using fewer or additional components than illustrated in FIG. 4B.

In FIG. 4B, electrical circuit 300-2 is similar to electrical circuit 300-1 of FIG. 4A but is shown to include fins (RHE) 320-2 of transformer 310 instead of copper moat (RHE) 320-1 of FIG. 4A. Power FET 306 may utilize fins 320-2 to dissipate heat generated by power FET 306. Fins 320-2 may include one or more vertical plates that are perpendicular to transformer PCB 412, which may be more conducive for natural convective cooling. A vertical plate may be able to dissipate almost twice the amount of heat versus a horizontal plate because heat dissipation by natural convective and radiation occurs from more surfaces of the vertical plate having a larger surface area than the horizontal plate, which has fewer surfaces and a smaller surface area. The same amount of heat may be dissipated at fins 320-2 as the heat dissipated at a horizontal copper moat of transformer PCB 412 but fins 320-2 may utilize an area of transformer PCB 412 that is significantly smaller in size than the size of the area utilized for the horizontal copper moat. For example, fins 320-2 may utilize an area of transformer PCB 412 about one fifth the size of the horizontal copper moat of transformer PCB 412.

Figure 4C:
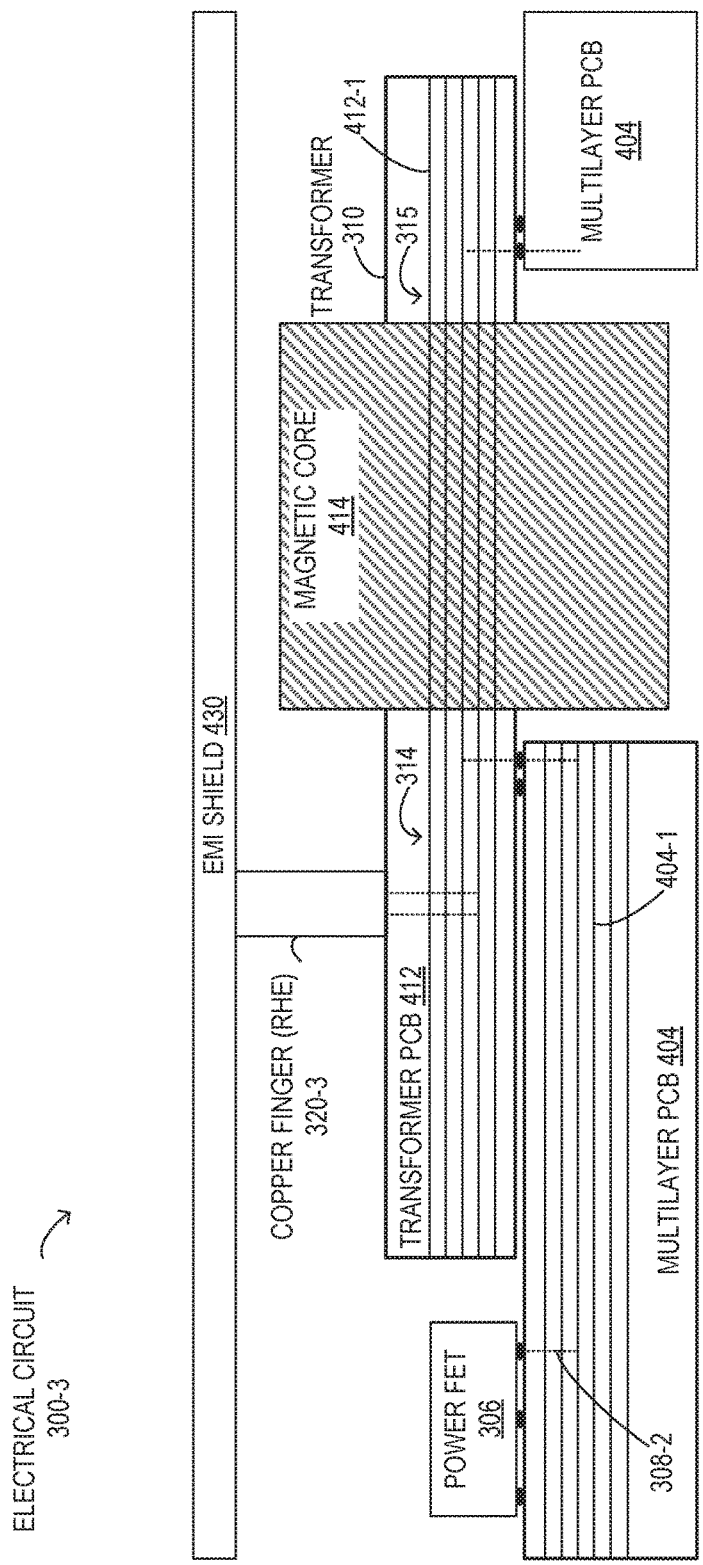

Referring now to FIG. 4C, an exemplary implementation of electrical circuit 300-3 is shown. It is noted that FIG. 4C is not drawn to scale but is a schematic representation of the cross section of electrical circuit 300 of FIG. 3, in which certain details and connections are not visible for descriptive purposes. In various embodiments, electrical circuit 300 may be implemented using fewer or additional components than illustrated in FIG. 4C.

In FIG. 4C, electrical circuit 300-3 is similar to electrical circuit 300-2 of FIG. 4B but is shown to include copper finger (RHE) 320-3 of transformer 310 instead of fins (RHE) 320-2 of FIG. 4B. Copper finger 320-3 may be thermally coupled to an EMI shield 430. EMI shield 430 may comprise copper and may act as a heat spreader to dissipate heat. Power FET 306 may utilize copper finger 320-3 and EMI shield 430 to dissipate heat generated by power FET 306. During operation, copper finger 320-3 may transfer a portion of the heat transferred to transformer 310 from power FET 306 to EMI shield 430. Copper finger 320-3 and EMI shield may dissipate the portion of the heat to cool power FET 306.

Figure 4D:
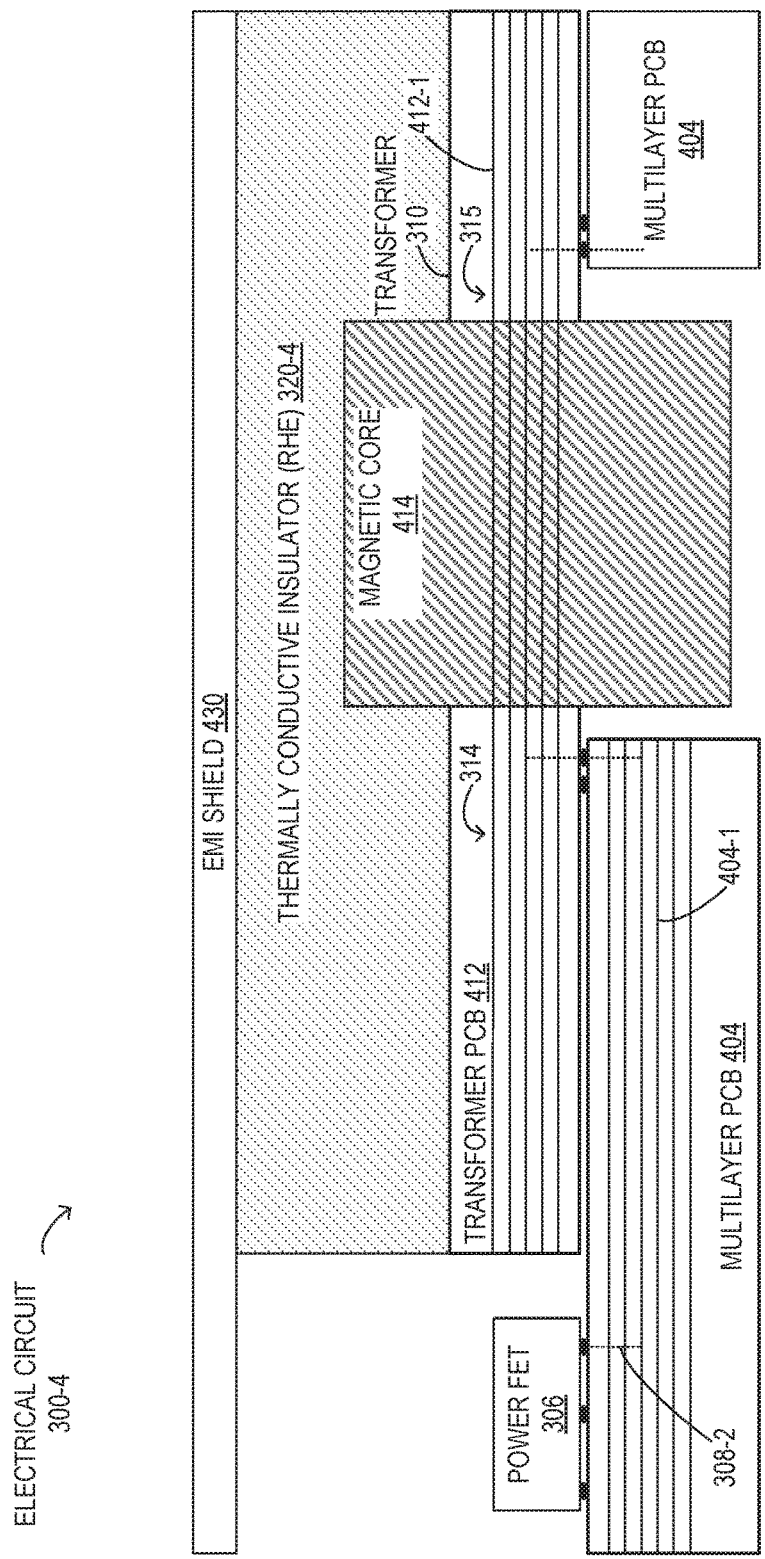

Referring now to FIG. 4D, an exemplary implementation of electrical circuit 300-4 is shown. It is noted that FIG. 4D is not drawn to scale but is a schematic representation of the cross section of electrical circuit 300 of FIG. 3, in which certain details and connections are not visible for descriptive purposes. In various embodiments, electrical circuit 300-4 may be implemented using fewer or additional components than illustrated in FIG. 4D.

In FIG. 4D, electrical circuit 300-4 is similar to electrical circuit 300-3 of FIG. 4C but is shown to include thermally conductive insulator (RHE) 320-4 of transformer 310 instead of copper finger (RHE) 320-3 of FIG. 4C. Thermally conductive insulator 320-4 may comprise a chamber formed on transformer PCB 412, the chamber filled with a thermally conductive insulator and thermally coupled to EMI shield 430. Power FET 306 may utilize thermally conductive insulator 320-4 and EMI shield 430 to dissipate heat generated by power FET 306. During operation, thermally conductive insulator 320-4 may allow a portion of the heat transferred to transformer 310 from power FET 306 to be transferred through thermally conductive insulator 320-4 to EMI shield 430. Thermally conductive insulator 320-4 and EMI shield may dissipate the portion of the heat to cool power FET 306. In some embodiments, the gap/region between power FET 306, multilayer PCB 404, and transformer 310 may also be filled with the thermally conductive insulator to promote heat flow at those interfaces as well.

As described herein, AC-DC converter 176 may utilize power FET 306 and transformer 310 to convert an AC voltage to a DC voltage. Other components of power storage adapter 172 may utilize power FET 306 and transformer 310 for other purposes. For example, DC-DC converter 178 may utilize power FET 306 and transformer 310 to convert a first DC voltage at a first voltage level to a second DC voltage at a second voltage level.

As disclosed herein, a power adapter device may include a power field effect transistor (FET), a transformer including a radiant heat exchanger, and electrical conductors coupled between the power FET and the transformer. The electrical conductors may transfer heat generated by the power FET from the power FET to the transformer. The radiant heat exchanger may dissipate a portion of the heat to cool the power FET. As such, the radiant heat exchanger may function as a heat sink for the power FET, enabling efficient heat dissipation using a compact design.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A power adapter device, comprising:
    a transformer further comprising:
        a transformer printed circuit board (PCB), including primary windings; and
        a radiant heat exchanger thermally coupled to the transformer PCB; and
    a multilayer PCB configured to receive an alternating current (AC) power source, the multilayer PCB further comprising:
        a power field effect transistor (FET) coupled to the AC power source at a first input node and coupled to the primary windings at a first output node via a first electrical conductor; and
        a second electrical conductor in proximity to the power FET and coupled to the primary windings and to the AC power source;
    wherein:
    the first electrical conductor and the second electrical conductor form a heat transfer path between the power FET and the transformer;
    when a first temperature of the power FET is greater than a second temperature of the transformer, heat flows via the heat transfer path to the transformer; and
    the transformer is cooled by the radiant heat exchanger, wherein the first temperature of the power FET is maintained below a maximum value when the power FET is in operation.

2. The power adapter device of claim 1, wherein the radiant heat exchanger further comprises at least one of a copper moat, fins, a fin stack, a plate, a radiant cooler, a copper finger thermally coupled to an electromagnetic interference (EMI) shield.

3. The power adapter device of claim 1, wherein the radiant heat exchanger further comprises a chamber formed on the transformer PCB, the chamber filled with a thermally conductive insulator and thermally coupled to an EMI shield.

4. The power adapter device of claim 1, wherein the radiant heat exchanger comprises at least one of copper, graphene, graphite, aluminum nitride, an aluminum alloy, silicon carbide, and silicon nitride.

5. The power adapter device of claim 1, wherein the power FET further comprises one of a gallium nitride (GaN) FET and a gate all around (GAA) FET.

6. The power adapter device of claim 1, wherein the first electrical conductor and the second electrical conductor are formed as multilayer traces in the multilayer PCB, and wherein the first electrical conductor and the second electrical conductor comprise copper.

7. The power adapter device of claim 1, wherein the power FET is operated using only the heat transfer path for cooling the power FET.

8. A transformer comprising:
    a transformer printed circuit board (PCB), including primary windings; and
    a radiant heat exchanger thermally coupled to the transformer PCB, the transformer coupled to a multilayer PCB,
    the multilayer PCB configured to receive an alternating current (AC) power source, the multilayer PCB further comprising:
        a power field effect transistor (FET) coupled to the AC power source at a first input node and coupled to the primary windings at a first output node via a first electrical conductor; and
        a second electrical conductor in proximity to the power FET and coupled to the primary windings and to the AC power source;
    wherein:
    the first electrical conductor and the second electrical conductor form a heat transfer path between the power FET and the transformer;
    when a first temperature of the power FET is greater than a second temperature of the transformer, heat flows via the heat transfer path to the transformer; and
    the transformer is cooled by the radiant heat exchanger, wherein the first temperature of the power FET is maintained below a maximum value when the power FET is in operation.

9. The transformer of claim 8, wherein the radiant heat exchanger further comprises at least one of a copper moat, fins, a fin stack, a plate, a radiant cooler, a copper finger thermally coupled to an electromagnetic interference (EMI) shield.

10. The transformer of claim 8, wherein the radiant heat exchanger further comprises a chamber formed on the transformer PCB, the chamber filled with a thermally conductive insulator and thermally coupled to an EMI shield.

11. The transformer of claim 8, wherein the radiant heat exchanger comprises at least one of copper, graphene, graphite, aluminum nitride, an aluminum alloy, silicon carbide, and silicon nitride.

12. The transformer of claim 8, wherein the power FET further comprises one of a gallium nitride (GaN) FET and a gate all around (GAA) FET.

13. The transformer of claim 8, wherein the first electrical conductor and the second electrical conductor are formed as multilayer traces in the multilayer PCB, and wherein the first electrical conductor and the second electrical conductor comprise copper.

14. The transformer of claim 8, wherein the power FET is operated using only the heat transfer path for cooling the power FET.

15. An electrical circuit comprising:
    a transformer including:
        primary windings; and
        a radiant heat exchanger thermally coupled to the transformer; and
    a power field effect transistor (FET) coupled to an alternating current (AC) power source at a first input node and coupled to the primary windings at a first output node via a first electrical conductor; and
    a second electrical conductor coupled to the primary windings and to the AC power source;
    wherein:
    the first electrical conductor and the second electrical conductor form a heat transfer path between the power FET and the transformer;

when a first temperature of the power FET is greater than a second temperature of the transformer, heat flows via the heat transfer path to the transformer; and the transformer is cooled by the radiant heat exchanger, wherein the first temperature of the power FET is maintained below a maximum value when the power FET is in operation.

16. The electrical circuit of claim 15, wherein the radiant heat exchanger further comprises at least one of a copper moat, fins, a fin stack, a plate, a radiant cooler, a copper finger thermally coupled to an electromagnetic interference (EMI) shield.

17. The electrical circuit of claim 15, wherein the radiant heat exchanger further comprises a chamber formed on the transformer PCB, the chamber filled with a thermally conductive insulator and thermally coupled to an EMI shield.

18. The electrical circuit of claim 15, wherein the radiant heat exchanger comprises at least one of copper, graphene, graphite, aluminum nitride, an aluminum alloy, silicon carbide, and silicon nitride.

19. The electrical circuit of claim 15, wherein the power FET further comprises one of a gallium nitride (GaN) FET and a gate all around (GAA) FET.

20. The electrical circuit of claim 15, wherein the power FET is operated using only the heat transfer path for cooling the power FET.

* * * * *